United States Patent
Terada et al.

(10) Patent No.: US 9,041,407 B2
(45) Date of Patent: May 26, 2015

(54) OSCILLATION CIRCUIT AND TEST CIRCUIT

(71) Applicant: Sony Corporation, Tokyo (JP)

(72) Inventors: Haruhiko Terada, Kanagawa (JP); Kohei Homma, Kanagawa (JP)

(73) Assignee: Sony Corporation, Tokyo (JP)

( * ) Notice: Subject to any disclaimer, the term of this patent is extended or adjusted under 35 U.S.C. 154(b) by 386 days.

(21) Appl. No.: 13/678,597

(22) Filed: Nov. 16, 2012

(65) Prior Publication Data

US 2013/0134984 A1 May 30, 2013

(30) Foreign Application Priority Data

Nov. 28, 2011 (JP) .................................. 2011-258424

(51) Int. Cl.
| | |
|---|---|
| G01R 31/26 | (2014.01) |
| G01R 27/08 | (2006.01) |
| G01R 31/02 | (2006.01) |
| G01R 31/30 | (2006.01) |
| H03K 3/03 | (2006.01) |

(52) U.S. Cl.
CPC ........ G01R 31/2621 (2013.01); G01R 31/3008 (2013.01); H03K 3/0315 (2013.01)

(58) Field of Classification Search
USPC .............................. 324/509, 711, 719, 762.01
See application file for complete search history.

(56) References Cited

U.S. PATENT DOCUMENTS 8,330,478 B2 *  12/2012  Myers et al. ............... 324/750.3

FOREIGN PATENT DOCUMENTS

JP   2010-043927   2/2010

* cited by examiner

*Primary Examiner* — Jermele M Hollington
*Assistant Examiner* — Farhana Hoque
(74) *Attorney, Agent, or Firm* — Fishman Stewart Yamaguchi PLLC

(57) ABSTRACT

Disclosed herein is an oscillation circuit including: a control transistor changing an electric potential at an output terminal thereof by proceeding to one of a conduction state and a non-conduction state in accordance with an electric potential at an input terminal thereof; a transistor as an object of a measurement having a polarity of a channel identical to that of the control transistor, and connected in series with the control transistor between a power source and a ground; a capacitor delaying the change in the electric potential at the output terminal in accordance with a value of a leakage current leaked from the transistor as an object of a measurement when the control transistor proceeds from the conduction state to the non-conduction state; and an inversion circuit inverting the electric potential at the output terminal, thereby feeding the inverted electric potential back to the input terminal.

9 Claims, 14 Drawing Sheets

FIG.13

| OSCILLATION CONTROL SIGNAL nOSC | MODE SIGNAL nMODE | TRANSISTOR AS OBJECT OF MEASUREMENT 312 | OUTPUT SIGNAL nOUT |
|---|---|---|---|
| H | L | OFF | OSCILLATION IS CAUSED AT FREQUENCY CORRESPONDING TO LEAKAGE CURRENT (LEAKAGE CURRENT MEASUREMENT) |
| H | H | ON OR OFF | OSCILLATION IS CAUSED AT FREQUENCY CORRESPONDING TO ON-STATE CURRENT (DETERIORATION TEST) |
| L | L/H | ON OR OFF | L (TEST STOP) |

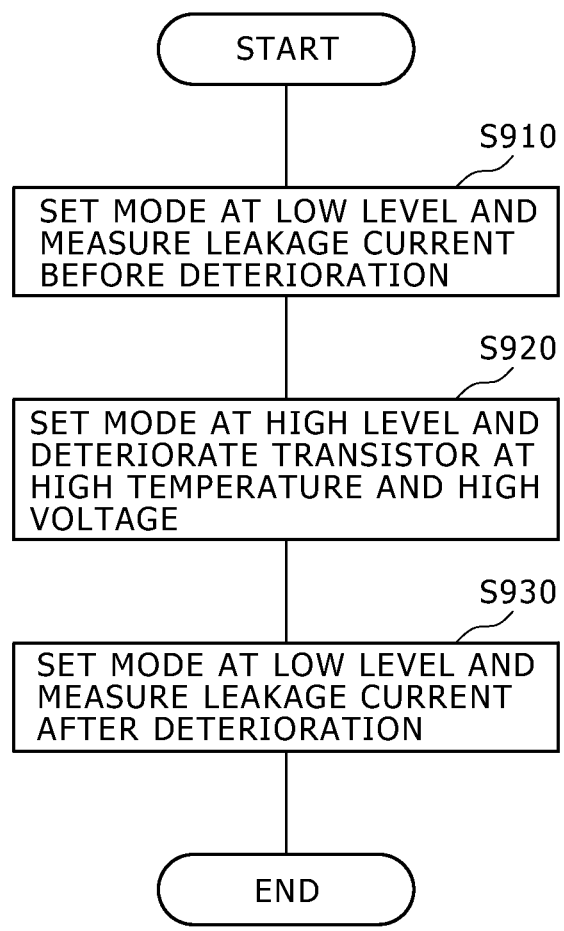

OSCILLATION CIRCUIT AND TEST CIRCUIT

BACKGROUND

The present disclosure relates to an oscillation circuit and a test circuit, and more particularly to an oscillation circuit for measuring a leakage current, and a test circuit including the same.

In recent years, along with scale down of integrated circuits, a leakage current which is leaked from a transistor held in a non-conduction state has been increased, and an influence by the leakage current (for example, an increase in a power consumption in a phase of standby) has been disable to be ignored. For this reason, for example, in a phase of development of the integrated circuits, in a phase of release testing of the integrated circuits, and the like, it is necessary to measure the leakage currents in many cases. The leakage current largely differs every transistor depending on the kind and shape of the transistor within the integrated circuits, the dispersion of the quality in the phase of the manufacture, and the like. For this reason, it is required to locally measure the leakage current as much as possible in an area in which the transistors are integrated. For the purpose of locally measuring the leakage current, a dedicated test circuit is incorporated in a portion as an object of a measurement in many cases.

For example, there is proposed a test circuit using a Negative Metal-Oxide-Semiconductor (nMOS) transistor, a Positive MOS (pMOS) transistor, a comparator, and an inverter group. This test circuit, for example, is described in Japanese Patent Laid-Open No. 2010-43927. In this test circuit, the pMOS transistor and the nMOS transistor are connected in series with each other between a power source and the ground. The nMOS transistor is set to a non-conduction state by the grounding of both of a gate terminal and a source terminal. Also, each of output terminals of the nMOS transistor and the pMOS transistor connected in series is connected to an input terminal of the comparator. The inverter group serves to invert an output signal from the comparator and to feed the inverted output signal as an input signal back to the pMOS transistor.

When the input signal rises in the test circuit described above, in addition to the nMOS transistor, the pMOS transistor is also set to the non-conduction state. When the pMOS transistor and the nMOS transistor are both held in the non-conduction state, an electric potential at the output terminal of the nMOS transistor is gradually reduced due to the leakage current from the nMOS transistor. Also, when the electric potential at the output terminal of the nMOS transistor becomes lower than a reference electric potential, the output signal from the comparator falls.

A delay time from the fall of the input signal of the pMOS transistor to the fall of the output signal from the comparator is a time based on the leakage current from the nMOS transistor held in the non-conduction state. For this reason, the output signal from the comparator is changed at a frequency corresponding to that leakage current. A value of the leakage current from the nMOS transistor held in the non-conduction state is measured from the frequency. A leakage current from the pMOS transistor is also measured by a circuit having a symmetrical configuration.

SUMMARY

However, with the semiconductor integrated circuit described above, it is feared that the measurement of the leakage current becomes difficult from the following reasons. The dispersion of the characteristics of both of the nMOS transistor and the pMOS transistor is generally more remarkable than the dispersion of the characteristics between the nMOS transistors or between the pMOS transistors. For this reason, the dispersion of the difference in the leakage current between the nMOS transistor and the pMOS transistor becomes larger than the dispersion of the difference in the leakage current between the nMOS transistors or between the pMOS transistors in many cases. When that dispersion is large, it is the possibility that the leakage current of the nMOS transistor as the object of the measurement becomes equal to or smaller than the leakage current from the pMOS transistor and thus the electric potential at the output terminal of the nMOS transistor is not sufficiently reduced. In this case, the frequency of the output signal from the comparator gets a value different from the frequency corresponding to the leakage current from the nMOS transistor. As a result, the precise measurement of the leakage current from the nMOS transistor is difficult to carry out. This also applies to the leakage current from the pMOS transistor.

The present disclosure has been made in order to solve the problems described above, and it is therefore desirable to provide an oscillation circuit and a test circuit each of which is capable of precisely measuring a leakage current leaked from a transistor held in a non-conduction state.

In order to attain the desire described above, according to an embodiment of the present disclosure, there is provided an oscillation circuit including: a control transistor changing an electric potential at an output terminal thereof by proceeding to one of a conduction state and a non-conduction state in accordance with an electric potential at an input terminal thereof; a transistor as an object of a measurement having a polarity of a channel which is identical to a polarity of a channel of the control transistor, and connected in series with the control transistor between a power source and a ground; a capacitor delaying the change in the electric potential at the output terminal of the control transistor in accordance with a value of a leakage current leaked from the transistor as an object of a measurement when the control transistor proceeds from the conduction state to the non-conduction state; and an inversion circuit inverting the electric potential at the output terminal of the control transistor, thereby feeding the inverted electric potential back to the input terminal of the control transistor.

As a result, there is offered an operation such that the change of the electric potential at the output terminal is delayed in accordance with the value of the leakage current leaked from the transistor as an object of a measurement.

Preferably, according to the embodiment of the present disclosure, the oscillation circuit may further include a delay controlling portion configured to cause the transistor as an object of a measurement to proceed to the non-conduction state when a delay instruction signal to instruct the change of the electric potential at the output terminal of the control transistor to be delayed is inputted, and cause the transistor as an object of a measurement to proceed to one of the conduction state and the non-conduction state in accordance with the electric potential at the input terminal of the control transistor when the delay instruction signal is not inputted.

As a result, there is offered an operation such that when the delay instruction signal is inputted to the delay controlling portion, the transistor as an object of a measurement is caused to proceed to the non-conduction state, and when the delay instruction signal is not inputted to the delay controlling portion, the transistor as an object of a measurement is caused to proceed to one of the conduction state and the non-conduction state in accordance with the electric potential at the input terminal thereof.

Preferably, according to the embodiment of the present disclosure, the transistor as an object of a measurement may include: a control terminal through which the transistor as an object of a measurement is controlled so as to be held either in the conduction state or in the non-conduction state; a first connection terminal connected either to the power source or to the ground, and the control terminal; and a second connection terminal connected to the output terminal of the control transistor.

As a result, there is offered an operation such that the first connection terminal of the transistor as an object of a measurement is connected either to the power source or to the ground, and the control terminal.

Preferably, according to the embodiment of the present disclosure, the transistor as an object of a measurement may be a transistor from which a leakage current whose value is larger than that of a leakage current leaked from the control transistor is leaked when each of the transistor as an object of a measurement, and the control transistor is held in the non-conduction state.

As a result, there is offered an operation such that the leakage current whose value is larger than that of the leakage current leaked from the control transistor is leaked from the transistor as an object of a measurement.

Preferably, according to the embodiment of the present disclosure, the transistor as an object of a measurement may include plural transistors connected in parallel with one another between the power source and the ground; and the plural transistors may be transistors each having a polarity of a channel which is identical to a polarity of a channel of the control transistor.

As a result, there is offered an operation such that the transistor as an object of a measurement includes the plural transistors connected in parallel with one another between the power source and the ground.

Preferably, according to the embodiment of the present disclosure, the inversion circuit may inverse the electric potential at the output terminal of the control transistor, thereby feeding the inverted electric potential back to the input terminal of the control transistor when an oscillation instruction signal to instruct the electric potential at the output terminal to oscillate is inputted, and may fix the electric potential at the input terminal to a predetermined electric potential when the oscillation instruction signal is not inputted.

As a result, there is offered an operation such that when the oscillation instruction signal is inputted to the inversion circuit, the inversion circuit inverts the electric potential at the output terminal of the control transistor, thereby feeding the inverted electric potential back to the input terminal of the control transistor, and when the oscillation instruction signal is not inputted to the inversion circuit, the inversion circuit fixes the electric potential at the input terminal of the control transistor to the predetermined electric potential.

According to another embodiment of the present disclosure, there is provided an oscillation circuit including: a delay circuit group having plural delay circuits each including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of the control transistor, and connected in series with the control transistor between a power source and a ground, and a capacitor delaying the change in the electric potential at the output terminal of the control transistor in accordance with a value of a leakage current leaked from the transistor as an object of a measurement when the control transistor proceeds from the conduction state to the non-conduction state, the plural delay circuits being connected in a ring-like shape by connection between the output terminals and the input terminals of the plural delay circuits; and an oscillation controlling circuit inverting the electric potentials at the output terminals of the plural delay circuits, thereby making the inverted electric potentials the electric potentials at the input terminals connected to the respective output terminals when an oscillation instruction signal to instruct the electric potentials at the output terminals of the plural delay circuits to oscillate is inputted, and fixing the electric potentials at the input terminals in such a way that at least one of the electric potentials at the input terminals of the plural delay circuits becomes an electric potential having a different polarity when the oscillation instruction signal is not inputted.

As a result, there is offered an operation such that when the oscillation instruction signal is inputted to the oscillation controlling circuit, the oscillation controlling circuit inverts the electric potentials at the output terminals of the plural delay circuits, thereby making the inverted electric potentials the electric potentials at the input terminals connected to the respective output terminals, and when the oscillation instruction signal is not inputted to the oscillation controlling circuit, the oscillation controlling circuit fixes the electric potentials at the input terminals in such a way that at least one of the electric potentials at the input terminals of the plural delay circuits becomes the electric potential having the different polarity.

According to still another embodiment of the present disclosure, there is provided a test circuit including: an oscillation circuit including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of the control transistor, and connected in series with the control transistor between a power source and a ground, a capacitor delaying the change in the electric potential at the output terminal of the control transistor in accordance with a value of a leakage current leaked from the transistor as an object of a measurement when the control transistor proceeds from the conduction state to the non-conduction state, and an inversion circuit inverting the electric potential at the output terminal of the control transistor, thereby feeding the inverted electric potential back to the input terminal of the control transistor; and a counting circuit counting the number of times by which the electric potential at the output terminal is inverted within a predetermined period of time.

As a result, there is offered an operation such that the change in the electric potential at the output terminal of the control transistor is delayed in accordance with the value of the leakage current leaked from the transistor as an object of a measurement, and the number of times by which the electric potential at the output circuit of the control transistor is inverted within the predetermined period of time is counted.

According to yet another embodiment of the present disclosure, there is provided a test circuit including: a delay circuit group having plural delay circuits each including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of the control transistor, and connected in series with the control transistor between a power source and a ground, and a capacitor delaying the change in the electric potential at the output terminal of the control transistor in accordance with a value of a leakage current leaked from the transistor as an object of a measurement when the control transistor proceeds from the conduction state to the non-conduction state, the plural delay circuits being connected in a ring-like shape by connection between the output terminals and the input terminals of the plural delay circuits; an oscillation controlling circuit inverting the electric potentials at the output terminals of the plural delay circuits, thereby making the inverted electric potentials the electric potentials at the input terminals connected to the respective output terminals when an oscillation instruction signal to instruct the electric potentials at the output terminals of the plural delay circuits to oscillate is inputted, and fixing the electric potentials at the input terminals in such a way that at least one of the electric potentials at the input terminals of the plural delay circuits becomes an electric potential having a different polarity when the oscillation instruction signal is not inputted; and a counting circuit counting the number of times by which the electric potential at any one of the output terminals is inverted within a predetermined period of time.

As a result, there is offered an operation such that when the oscillation instruction signal is inputted to the oscillation controlling circuit, the oscillation controlling circuit inverts the electric potentials at the output terminals of the plural delay circuits, thereby making the inverted electric potentials the electric potentials at the input terminals connected to the respective output terminals, and when the oscillation instruction signal is not inputted to the oscillation controlling circuit, the oscillation controlling circuit fixes the electric potentials at the input terminals in such a way that at least one of the electric potentials at the input terminals of the plural delay circuits becomes the electric potential having the different polarity.

As set forth hereinabove, according to the present disclosure, it is possible to offer the excellent effect such that the test circuit including the oscillation circuit can precisely measure the leakage current.

BRIEF DESCRIPTION OF THE DRAWINGS

FIG. 13 is a table explaining an operation of the nMOS leakage current monitor in the second embodiment of the present disclosure; and FIG. 14 is a flow chart explaining an operation of a control circuit in the test circuit according to the second embodiment of the present disclosure.

DETAILED DESCRIPTION OF THE PREFERRED EMBODIMENTS

Embodiments of the present disclosure will be described in detail hereinafter with reference to the accompanying drawings. It is noted that the description will be given below in accordance with the following order.

1. First Embodiment (oscillation control: the case where oscillation is caused at a frequency corresponding to a value of a leakage current)

2. Second Embodiment (oscillation control: the case where oscillation is caused by switching a frequency)

1. First Embodiment

Configuration of Semiconductor Integrated Circuit

Figure 1:
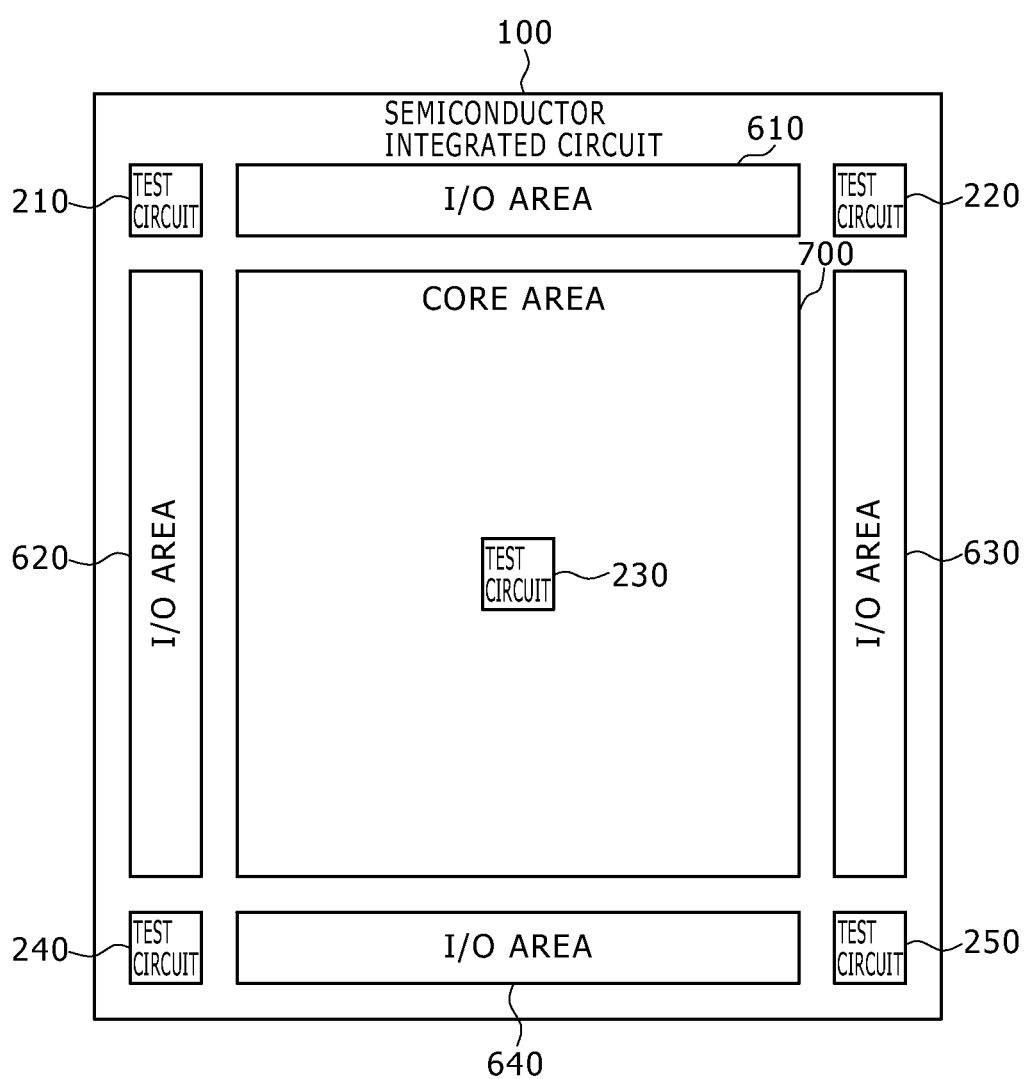
FIG. 1 is a block diagram showing a configuration of a semiconductor integrated circuit including a test circuit according to a first embodiment of the present disclosure.

FIG. 1 is a block diagram showing a configuration of a semiconductor integrated circuit 100 including a test circuit according to a first embodiment of the present disclosure. The semiconductor integrated circuit 100 is a circuit in which a large number of semiconductor elements such as transistors are integrated. The semiconductor integrated circuit 100 includes test circuits 210, 220, 230, 240, and 250, I/O (input-output) areas 610, 620, 630, and 640, and a core area 700.

The test circuits 210, 220, 230, 240, and 250 are respectively circuits for measuring leakage currents in predetermined portions within the semiconductor integrated circuit 100. The measurements of the leakage currents, for example, are carried out in a phase of development of the semiconductor integrated circuit 100 or right before product shipment. Details of configurations of these test circuits 210, 220, 230, 240, and 250 will be described later. The I/O areas 610, 620, 630, and 640 serve to input signals from a circuit or apparatus disposed outside the semiconductor integrated circuit 100 to the core area 700, and to output signals from the core area 700 to the outside. The core area 700 is an area in which a large number of semiconductor elements such as transistors are integrated.

[Configuration of Test Circuit]

Figure 2:
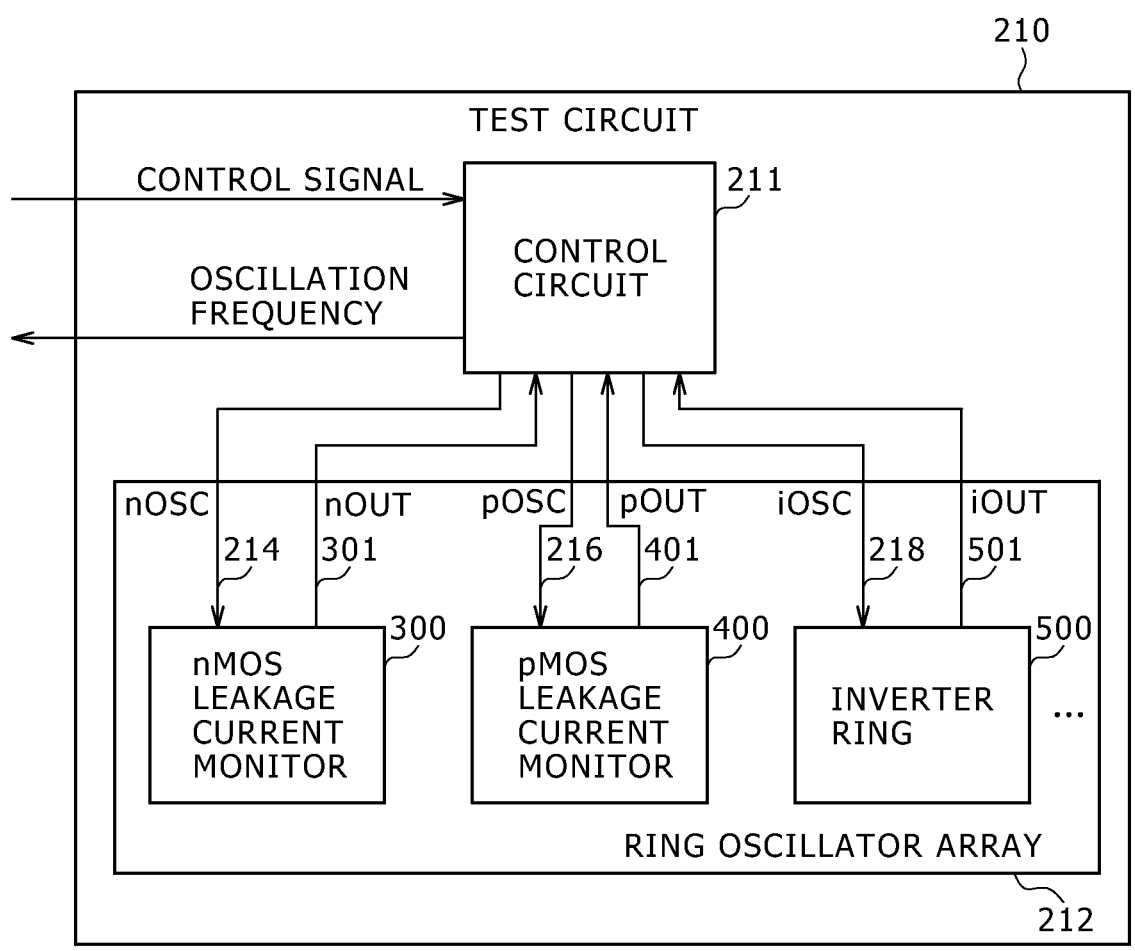
FIG. 2 is a block diagram showing a configuration of the test circuit according to the first embodiment of the present disclosure.

FIG. 2 is a block diagram showing a configuration of the test circuit 210 according to the first embodiment of the present disclosure. The test circuit 210 includes a control circuit 211 and a ring oscillator array 212. Each of the test circuits 220, 230, 240, and 250 is identical in configuration to the test circuit 210.

The control circuit 211 measures an oscillation frequency of an output signal from the ring oscillator array 212 by controlling the ring oscillator array 212. A control signal in accordance with which the test circuit 210 is controlled is inputted from an external circuit or apparatus to the control circuit 211. A signal in accordance with which whether or not the oscillation frequency is measured is instructed for the control circuit 211 is contained in the control signal. The control circuit 211 outputs an oscillation control signal in accordance with which whether or not the oscillation is caused is instructed to the ring oscillator array 212 in accordance with the control signal. For example, the oscillation control signal is set to a high level when the oscillation is to be caused, and is set to a low level when the oscillation is to be stopped. Also, the control circuit 211 counts the number of times by which an output signal from the ring oscillator array 212 is inverted within a given period of time, and outputs the count value as an oscillation frequency. A value of a leakage current is calculated from the oscillation frequency. Details of a method of calculating the value of the leakage current will be described later. It is noted that the control circuit 211 is an example of a counting circuit. Also, the ring oscillator array 212 is an example of the oscillation circuit.

The ring oscillator array 212 serves to oscillate an output signal in accordance with the control made by the control circuit 211. The ring oscillator array 212 includes an nMOS leakage current monitor 300, a pMOS leakage current monitor 400, and an inverter ring 500.

The nMOS leakage current monitor 300 oscillates an output signal at a frequency corresponding to a leakage current from the nMOS transistor held in the non-conduction state in accordance with the control made by the control circuit 211. An oscillation control signal nOSC is inputted from the control circuit 211 to the nMOS leakage current monitor 300 through a signal line 214. In addition, the nMOS leakage current monitor 300 outputs an output signal nOUT to the control circuit 211 through a signal line 301. Here, the oscillation control signal nOSC is a signal in accordance with which whether or not the oscillation is caused is instructed for the nMOS leakage current monitor 300. When the oscillation is instructed by the oscillation control signal nOSC, the nMOS leakage current monitor 300 oscillates the output signal nOUT. On the other hand, when no oscillation is instructed by the oscillation control signal nOSC, the nMOS leakage current monitor 300 stops the oscillation by fixing the output signal nOUT to a given state (for example, a low level).

The pMOS leakage current monitor 400 oscillates the output signal at a frequency corresponding to a leakage current from the pMOS transistor held in the non-conduction state in accordance with the control made by the control circuit 211. An oscillation control signal pOSC from the control circuit 211 is inputted to the pMOS leakage current monitor 400 through a signal line 216. In addition, the pMOS leakage current monitor 400 outputs an output signal pOUT to the control circuit 211 through a signal line 401. Here, the oscillation control signal pOSC is a signal in accordance with which whether or not the oscillation is caused is instructed for the pMOS leakage current monitor 400. When the oscillation is instructed by the oscillation control signal pOSC, the pMOS leakage current monitor 400 oscillates the output signal pOUT. On the other hand, when no oscillation is instructed by the oscillation control signal pOSC, the pMOS leakage current monitor 400 stops the oscillation by fixing the output signal pOUT to a given state (for example, a low level).

The inverter ring 500 oscillates the output signal at a frequency corresponding to a delay time of an inverter in accordance with the control made by the control circuit 211. The inverter ring 500 includes one or more inverters which are connected in a ring-like shape. An oscillation control signal iOSC is inputted from the control circuit 211 to the inverter ring 500 through a signal line 218. In addition, the inverter ring 500 outputs an output signal iOUT to the control circuit 211 through a signal line 501. Here, the oscillation control signal iOSC is a signal in accordance with which whether or not the oscillation is caused is instructed for the inverter ring 500. When the oscillation is instructed by the oscillation control signal iOSC, the inverter ring 500 oscillates the output signal iOUT. On the other hand, when no oscillation is instructed by the oscillation control signal iOSC, the inverter ring 500 stops the oscillation by fixing the output signal iOUT to a given state (for example, the low level).

It is noted that although there is adopted a configuration in which the control circuit 211 measures the oscillation frequency of the output signal, it is also possible to adopt a configuration in which an external apparatus or circuit measures the oscillation frequency. In this case, the control circuit 211 does not measure the oscillation frequency, and the frequency of the output signal is changed by a frequency divider or the like, thereby outputting the resulting output signal. Also, the frequency of the output signal is measured by the external apparatus or the like.

[Configuration of nMOS Leakage Current Monitor]

Figure 3:
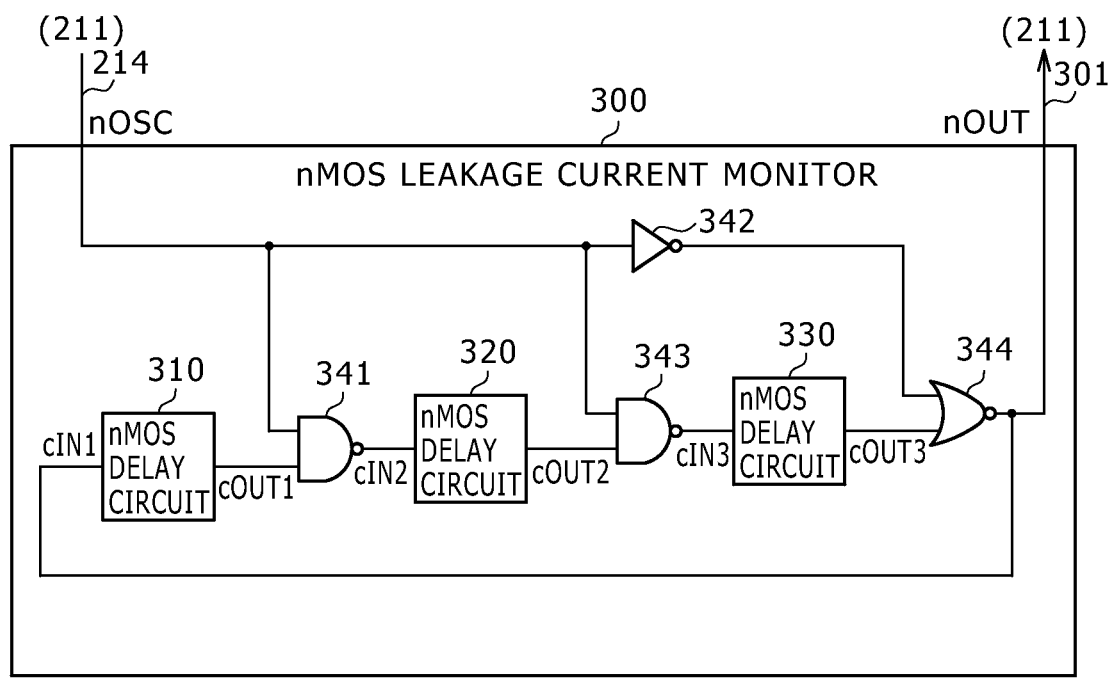
FIG. 3 is a circuit diagram showing a configuration of an nMOS leakage current monitor in the test circuit according to the first embodiment of the present disclosure.

FIG. 3 is a circuit diagram showing a configuration of the nMOS leakage current monitor 300 in the test circuit 210 of the first embodiment. The nMOS leakage current monitor 300 includes nMOS delay circuits 310, 320, and 330, NAND (negative AND) gates 341 and 343, an inverter 342, and a NOR (negative OR) gate 344. It is noted that the NOR gate 344 is an example of an inversion circuit. A circuit composed of the NAND gates 341 and 343, the inverter 342, and the NOR gate 344 is an example of an oscillation controlling circuit.

The nMOS delay circuits 310, 320, and 330 serve to delay changes of signals in accordance with values of leakage currents leaked from the nMOS transistors each held in the non-conduction state, respectively. The nMOS delay circuit 310 outputs a signal obtained by delaying a change of an input signal cIN1 as an output signal cOUT1 to an input terminal of the NAND gate 341. The nMOS delay circuit 320 outputs a signal obtained by delaying a change of an input signal cIN2 as an output signal cOUT2 to an input terminal of the NAND gate 343. Also, the nMOS delay circuit 330 outputs a signal obtained by delaying a change of an input signal cIN3 as an output signal cOUT3 to an input terminal of the NOR gate 344.

Each of the NAND gates 341 and 343 includes two input terminals, and outputs a negative AND of signals inputted to the two input terminals thereof, respectively. The NAND gate 341 outputs a negative AND of an oscillation control signal nOSC, and an output signal cOUT1 from the nMOS delay circuit 310 as an input signal cIN2 to the nMOS delay circuit 320. The NAND gate 343 outputs a negative AND of the oscillation control signal nOSC, and an output signal cOUT2 from the nMOS delay circuit 320 as an input signal cIN3 to the nMOS delay circuit 330.

The inverter 342 inverts the oscillation control signal nOSC and outputs the inverted oscillation control signal to an input terminal of the NOR gate 344. The NOR gate 344 includes two input terminals and outputs a negative OR of signals inputted to the two input terminals thereof, respectively. Specifically, the NOR gate 344 outputs a negative OR of an inverted oscillation control signal nOSC, and an output signal cOUT3 as an output signal nOUT to the control circuit 211, and feeds the negative OR as the input signal cIN1 back to the nMOS delay circuit 310.

With such a configuration, when the oscillation control signal nOSC is held at the high level, the NAND gates 341 and 343, and the NOR gate 344 invert the input signals from the nMOS delay circuits 310, 320, and 330, and output the inverted input signals, respectively. Since the output signal nOUT from the NOR gate 344 is fed back to the head nMOS delay circuit 310, the electric potential of the output signal nOUT from the NOR gate 344 is periodically changed. That is to say, the nMOS leakage current monitor 300 oscillates.

On the other hand, when the oscillation control signal nOSC is held at the low level, the NAND gates 341 and 343 fix the input signals cIN2 and cIN3 to the high level, and the NOR gate 344 fixes each of the input signal cIN1 and the output signal nOUT to the low level. As a result, the oscillation of the output signal nOUT is stopped. Since at least one of the input signals cIN1, cIN2, and cIN3 is fixed to the different electric potential, the electric potential of the input signal does not become indeterminate in a phase of start of the oscillation and thus the oscillation is reliably caused.

It is noted that the number of nMOS delay circuits included in the nMOS leakage current monitor 300 is by no means limited to three. When only one nMOS delay circuit is provided in the nMOS leakage current monitor 300, for example, it is only necessary that all of the nMOS delay circuits 310 and 320, and the NAND gates 341 and 343 are removed away and the oscillation control signal nOSC is inputted to the nMOS delay circuit 330. When two nMOS delay circuits are provided in the nMOS leakage current monitor 300, for example, it is only necessary that the nMOS delay circuit 310 is removed away, and the output signal from the NOR gate 344 is fed back to one input terminal of the NAND gate 341. When four or more nMOS delay circuits are provided in the nMOS leakage current monitor 300, both of a NAND gate and a delay circuit may be added to the nMOS leakage current monitor 300 as may be necessary.

In addition, although there is adopted the configuration in which the oscillation is controlled by the NAND gates 341 and 343, the inverter 342, and the NOR gate 344, the configuration of the circuit for controlling the oscillation is by no means limited to that configuration. Any other suitable configuration may also be adopted as long as the input signals to the nMOS delay circuits can be inverted when the oscillation is caused, and the input signals can be fixed in such a way that at least one of the input signals becomes the different electric potential when the oscillation is stopped. For example, each of the NAND gates 341 and 343 may be replaced with a NOR gate, and the NOR gate 344 may be replaced with the NAND gate. As a result, when the oscillation control signal nOSC is held at the low level, the input signals are inverted, and when the oscillation control signal nOSC is held at the high level, the input signal cIN1 is fixed to the high level, and each of the input signals cIN2 and cIN3 is fixed to the low level.

[Configuration of nMOS Delay Circuit]

Figure 4:
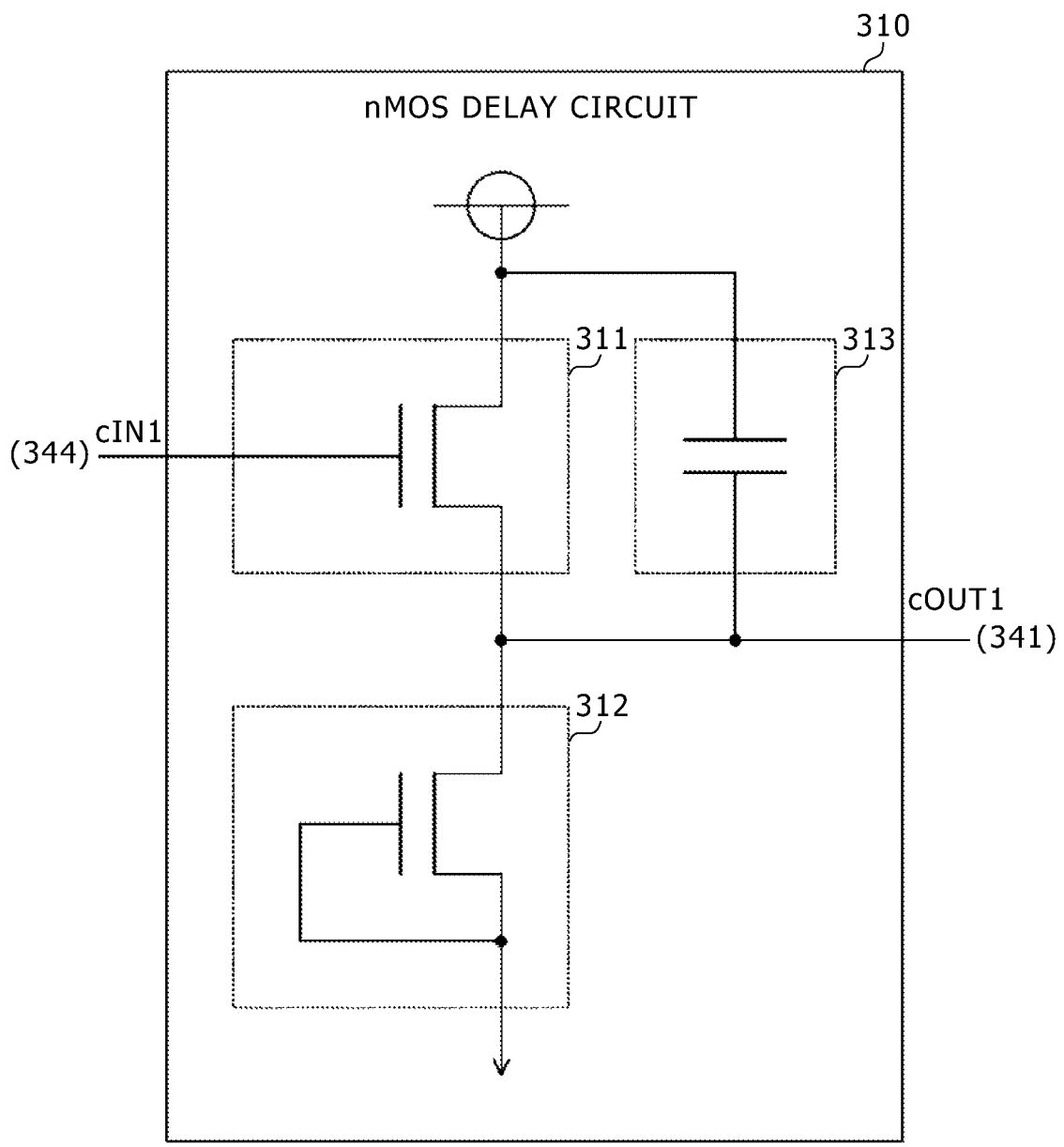
FIG. 4 is a circuit diagram showing a configuration of an nMOS delay circuit in the nMOS leakage current monitor in the test circuit according to the first embodiment of the present disclosure.

FIG. 4 is a circuit diagram showing a configuration of the nMOS delay circuit 310 in the nMOS leakage current monitor 300 in the test circuit 210 of the first embodiment. The nMOS delay circuit 310 includes a control transistor 311, a transistor 312 as an object of a measurement, and a capacitor 313. Each of the configurations of the nMOS delay circuits 320 and 330 is the same as that of the nMOS delay circuit 310.

The control transistor 311 changes the electric potential of the output signal cOUT in accordance with the input signal cIN1. For example, the nMOS transistor is used as the control transistor 311. In addition, in the control transistor 311, a gate terminal thereof is connected to an output terminal of the NOR gate 344, and a source electrode thereof is connected to the power source. Also, a drain electrode of the control transistor 311 is connected to each of an input terminal of the NAND gate 341, one terminal of the capacitor 313, and a drain electrode of the transistor 312 as an object of a measurement. It is noted that the gate electrode of the control transistor 311 is an example of an input terminal, and the drain electrode of the control transistor 311 is an example of an output terminal.

The transistor 312 as an object of a measurement is a transistor from which the leakage current as an object of a measurement is leaked. A MOS transistor which has the same polarity as that of the control transistor 311 and the value of the leakage current larger than that of the leakage current from the control transistor 311 is used as the transistor 312 as an object of a measurement. Here, the polarity of the transistor means a polarity of a channel. When the control transistor 311 of an n-type is used, similarly to this, a MOS transistor of an n-type is used as the transistor 312 as an object of a measurement. In addition, a transistor whose gate width, for example, is made larger than that of the control transistor 311 so as to increase the leakage current is used as the transistor 312 as an object of a measurement.

In addition, the transistor 312 as an object of a measurement is connected in series with the control transistor 311 between the power source and the ground so as to be usually held in the non-conduction state. Specifically, in the transistor 312 as an object of a measurement, each of the gate electrode and source electrode thereof is grounded, and the drain electrode thereof is connected to the drain electrode of the control transistor 311.

It is noted that each of the control transistor 311 and the transistor 312 as an object of a measurement is by no means limited to the MOS transistor as long as each of the control transistor 311 and the transistor 312 as an object of a measurement is composed of a replaceable transistor. For example, each of the control transistor 311 and the transistor 312 as an object of a measurement may be composed of a junction type field effect transistor instead of being composed of a MOS type field effect transistor.

The capacitor 313 delays the change of the signal by either charge or discharge. One terminal of the capacitor 313 is connected to the power source, and the other terminal thereof is connected to each of the drain electrodes of the control transistor 311 and the transistor 312 as an object of a measurement.

With such a circuit, when the input signal cIN1 falls, in addition to the transistor 312 as an object of a measurement, the control transistor 311 also becomes the non-conduction state. When the control transistor 311 also becomes the non-conduction state, the capacitor 313 is charged with the electric charges based on the leakage current leaked from the transistor 312 as an object of a measurement. The electric potential at the drain terminal of the control transistor 311 is reduced due to the charge of the capacitor 313, and the fall of the output signal cOUT1 is delayed for the charging time. Here, since the value of the leakage current from the transistor 312 as an object of a measurement is larger than that of the leakage current from the control transistor 311 as described above, when the input signal cIN1 falls, the electric potential at the drain electrode of the transistor 312 as an object of a measurement becomes sufficiently low. Therefore, the output signal cOUT reliably falls.

On the other hand, when the input signal cIN1 rises, the control transistor 311 becomes the conduction state and thus the electric charges accumulated in the capacitor 313 are discharged, so that the output signal cOUT1 rises accordingly.

Here, let Q be a total sum of a quantity of electricity which is charged/discharged in/from the capacitor 313, let C be an electrical capacitance of the capacitor 313, and let V be a difference in electric potential between the opposite terminals of the capacitor 313. The electric potential difference V becomes approximately equal to a power source voltage in a phase of completion of the discharge (or in a phase of start of the charge). A unit of the quantity Q of electricity, for example, is coulomb (C) or ampere second (A·s). A unit of the electrical capacitance, for example, is farad (F), and a unit of the electric potential difference V is volt (V).

In addition, let $I_{on}$ be a current which the control transistor 311 outputs in the conduction state (so-called "the on-state current"), and let $I_{leak}$ be the leakage current which is leaked from the transistor 312 as an object of a measurement held in the non-conduction state. Also, let $T_{rise}$ be a time from the rise of the input signal cIN1 to the rise of the output signal cOUT1 (hereinafter referred to as "a rise delay time"), and let $T_{fall}$ be a time from the fall of the input signal cIN1 to the fall of the output signal cOUT1 (hereinafter referred to as "a fall delay time"). A unit of each of $I_{on}$ and $I_{leak}$, for example, is ampere (A) and a unit of each of $T_{rise}$ and an $T_{fall}$ for example, is second (s).

Since the rise delay time $T_{rise}$ described above is the discharge time of the capacitor 313 due to the on-state current $I_{on}$, Expression (1) holds among Q, $T_{rise}$, and $I_{on}$:

$$Q = I_{on} \times T_{rise} \quad (1)$$

On the other hand, since the fall delay time $T_{fall}$ described above is the charge time of the capacitor 313 due to the leakage current $I_{leak}$, Expression (2) holds among Q, $T_{fall}$ and $I_{leak}$:

$$Q = I_{leak} \times T_{fall} \quad (2)$$

Expressions (3) and (4) are derived from Q=CV as a formula related to the quantity of electricity, and Expressions (1) and (2):

$$T_{rise} = C \times V/I_{on} \quad (3)$$

$$T_{fall} = C \times V/I_{leak} \quad (4)$$

Since the nMOS leakage current monitor 300 includes the three nMOS delay circuits, when let T be an oscillation period of the output signal nOUT of the nMOS leakage current monitor 300, and any of the delays of the logic gates other than the nMOS delay circuits 310, 320, and 330 is disregarded, Expression (5) is derived from Expressions (3) and (4):

$$T = 3 \times (T_{rise} + T_{fall}) \quad (5)$$
$$= 3C \times (V/I_{on} + V/I_{leak})$$

where a unit of the oscillation period T, for example, is second (s).

However, since in Expression (5), the leakage current $I_{leak}$ is sufficiently smaller than the on-state current $I_{on}$, the oscillation period T can be approximated in the form as expressed by Expression (6):

$$T \approx 3 \times T_{fall} = 3C \times V/I_{leak} \quad (6)$$

When let F be an oscillation frequency of the output signal nOUT, Expression (7) is derived from Expression (6):

$$F = 1/T = I_{leak}/\{3 \times (CV)\} \quad (7)$$

where a unit of the oscillation frequency F, for example, is hertz (Hz).

By using Expression (7), a precise value of the leakage current $I_{leak}$ is calculated from the measured value of the oscillation frequency F.

[Configuration of pMOS Leakage Current Monitor]

Figure 5:
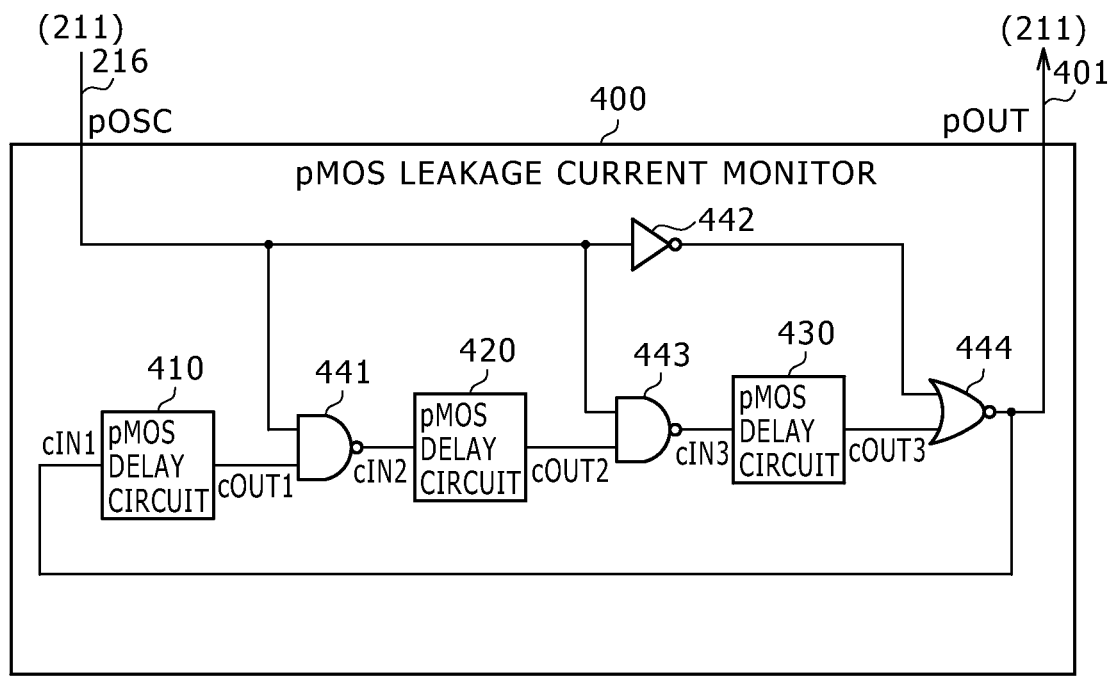
FIG. 5 is a circuit diagram showing a configuration of a pMOS leakage current monitor in the test circuit according to the first embodiment of the present disclosure.

FIG. 5 is a circuit diagram showing a configuration of the pMOS leakage current monitor 400 in the test circuit 210 of the first embodiment. The pMOS leakage current monitor 400 includes pMOS delay circuits 410, 420, and 430, NAND gates 441 and 443, an inverter 442, and a NOR gate 444. The NAND gates 441 and 443, the inverter 442, and the NOR gate 444 are identical in configurations to the NAND gates 341 and 343, the inverter 342, and the NOR gate 344 in the nMOS leakage current monitor 300. That is to say, the pMOS leakage current monitor 400 has the same configuration as that of the nMOS leakage current monitor 300 except that the pMOS leakage current monitor 400 includes the pMOS delay circuit 410 and the like instead of including the nMOS delay circuit 310 and the like.

Each of the pMOS delay circuits 410, 420, and 430 serve to delay the change in the signal in accordance with the value of the leakage current which is leaked from the pMOS transistor held in the non-conduction state.

[Configuration of pMOS Delay Circuit]

Figure 6:
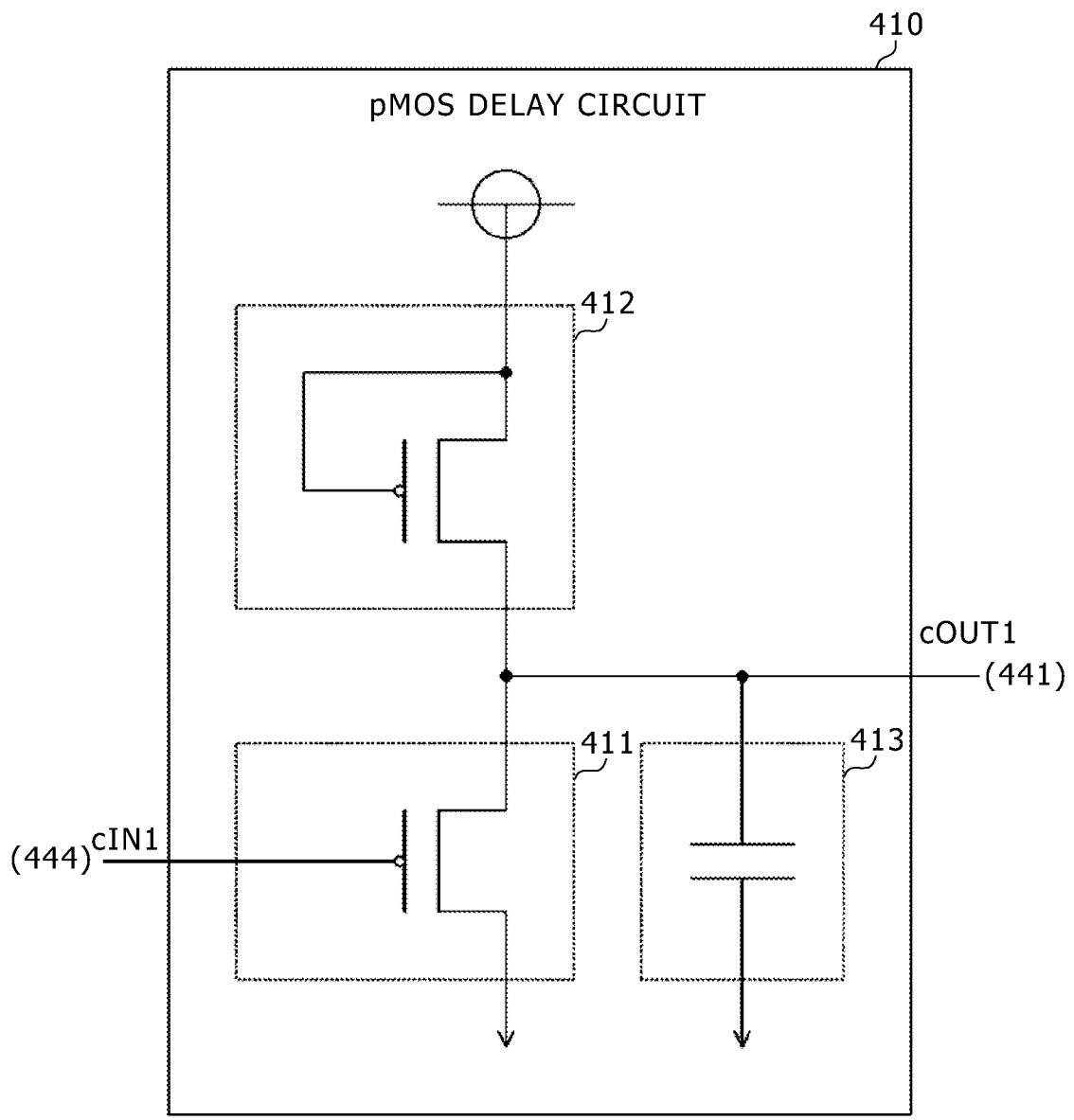
FIG. 6 is a circuit diagram showing a configuration of a pMOS delay circuit in the pMOS leakage current monitor in the test circuit according to the first embodiment of the present disclosure.

FIG. 6 is a circuit diagram showing a configuration of the pMOS delay circuit 410 in the pMOS leakage current monitor 400 in the test circuit 210 of the first embodiment. The pMOS delay circuit 410 includes a control transistor 411, a transistor 412 as an object of a measurement, and a capacitor 413. Each of the configurations of the pMOS delay circuits 420 and 430 is the same as that of the pMOS delay circuit 410.

The control transistor 411 changes the value of the output signal cOUT1 in accordance with the input signal cIN1. For example, the pMOS transistor is used as the control transistor 411. In addition, in the control transistor 411, a gate terminal thereof is connected to an output terminal of the NOR gate 444, and a source electrode thereof is grounded. Also, a drain electrode of the control transistor 411 is connected to each of an input terminal of the NAND gate 441, one terminal of the capacitor 413, and a drain electrode of the transistor 412 as an object of a measurement.

The transistor 412 as an object of a measurement is a transistor from which the leakage current as an object of a measurement is leaked. A MOS transistor which has a value of a leakage current larger than that of a leakage current from the control transistor 411 and has the same polarity (for example, the p-type) as that of the control transistor 411 is used as the transistor 412 as an object of a measurement. In addition, each of a gate electrode and a source electrode of the transistor 412 as an object of a measurement is connected to a power source, and a drain electrode thereof is connected to the drain electrode of the control transistor 411.

The capacitor 413 delays the change of the signal by either the charge or the discharge. One terminal of the capacitor 413 is grounded, and the other terminal thereof is connected to each of the drain electrodes of the control transistor 411 and the transistor 412 as an object of a measurement.

With such a circuit, when the input signal cIN1 rises, in addition to the transistor 412 as an object of a measurement, the control transistor 411 also becomes the non-conduction state. When the control transistor 411 also becomes the non-conduction state, the capacitor 413 is charged with the electric charges based on the leakage current leaked from the transistor 412 as an object of a measurement. Thus, the rise of the output signal cOUT1 is delayed for the charging time.

On the other hand, when the input signal cIN1 falls, the control transistor 411 becomes the conduction state and thus the electric charges accumulated in the capacitor 413 are discharged, so that the output signal cOUT1 falls accordingly.

The nMOS delay circuit 310 delays the fall of the input signal cIN1 in accordance with the leakage current, whereas the pMOS delay circuit 410 delays the rise of the input signal cIN1 in accordance with the leakage current. Therefore, when in Expression (6), the rise delay time $T_{rise}$ is substituted for the fall delay time $T_{fall}$, the oscillation period T of the output signal pOUT is obtained. Also, the oscillation period T of the output signal pOUT is calculated from Expression (7) similarly to the case of the output signal nOUT.

As described above, according to the first embodiment of the present disclosure, the nMOS leakage current monitor 300 can oscillate the electric potential at the output terminal at the frequency corresponding to the leakage current from the nMOS transistor. Specifically, when in the nMOS leakage current monitor 300, the n-type control transistor 311 proceeds to the non-conduction state, the capacitor 313 delays the change in the electric potential at the output terminal in accordance with the value of the leakage current leaked from the transistor 312 as an object of a measurement whose polarity of the channel is also the n-type. The NOR gate 344 inverts the electric potential at the output terminal thereof, and feeds the inverted electric potential back to the input terminal of the control transistor 311. As a result, the electric potential at the output terminal is changed at the frequency corresponding to the value of the leakage current. Also, the dispersion of the difference in the leakage current between the n-type transistors is generally smaller than that of the difference in the leakage current between the n-type transistor and the p-type transistor. For this reason, the test circuit 210 can precisely measure the leakage current of the n-type transistor by suppressing an influence of the dispersion of the difference in the leakage current between the transistors. This also applies to the leakage current from the p-type transistor.

Also, since the test circuit 210 can precisely measure the leakage current, the test circuit 210 can carry out the test (for example, a wafer test) for determining whether or not the transistor is a non-defective product with the high precision. Here, the wafer test is such that a measurement for an off-state current of the entire circuit, and a verification for the circuit operation at a low clock frequency are carried out after completion of the manufacture of the wafer. Also, the non-defective products are selected based on the results of the wafer test, and a module test as a final operation verification is carried out for a module into which only the non-defective products thus selected are assembled. The increasing of the precision in the wafer test results in that the results of the wafer test, and the results of the module test come to well agree with each other. For this reason, the loss due to the disagreement between the results of the wafer test, and the results of the module test is reduced, thereby reducing the manufacturing cost.

In addition, since it is unnecessary for each of the nMOS leakage current monitor 300 and the pMOS leakage current monitor 400 to provide therein any of the costly elements such as a comparator, and a reference voltage of the comparator, it is easy to incorporate the nMOS leakage current monitor 300 and the pMOS leakage current monitor 400 in the integrated circuit. For example, the nMOS leakage current monitor 300 and the pMOS leakage current monitor 400 can be readily incorporated in the integrated circuit which is manufactured by utilizing a gate array system for forming circuits on a substrate on which transistors are previously paved, a standard cell system for disposing designed standard cells or the like.

It is noted that the test circuit 210 can also obtain a temperature of the semiconductor integrated circuit 100 from the leakage current. In general, along with a rise in a temperature of a transistor, a leakage current from the transistor is increased. The test circuit 210 can monitor the temperature of the semiconductor integrated circuit 100 from the leakage current based on temperature dependency characteristics of the leakage current. When the temperature is desired to be monitored, it is preferable that the oscillation frequency is previously measured in a state in which the semiconductor integrated circuit 100 is held at a known temperature, and a temperature dependency model representing the temperature dependency characteristics of the leakage current is corrected based on both of the leakage current obtained from the oscillation frequency, and the temperature at which the semiconductor integrated circuit 100 is held.

[Modified Change]

Figure 7:
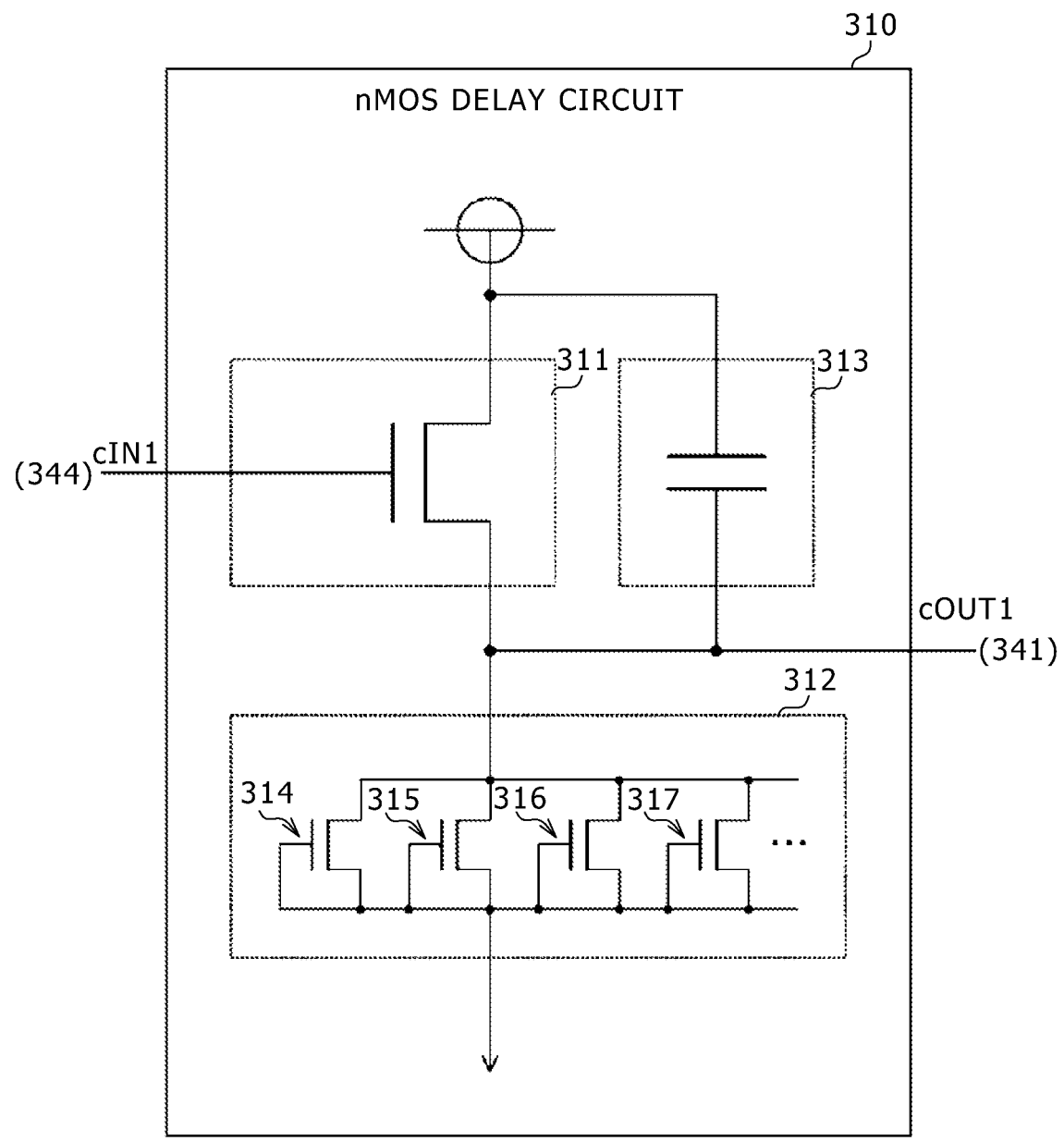
FIG. 7 is a circuit diagram showing a configuration of an nMOS delay circuit in an nMOS leakage current monitor in a test circuit according to a modified change of the first embodiment of the present disclosure.

A modified change of the first embodiment will be described below with reference to FIG. 7. FIG. 7 is a circuit diagram showing a configuration of an nMOS delay circuit 310 in the modified change of the first embodiment. The configuration of the nMOS delay circuit 310 in the modified change of the first embodiment is different from that of the nMOS delay circuit 310 in the first embodiment in that the transistor 312 as an object of a measurement includes plural nMOS transistors connected in parallel with one another.

The transistor 312 as an object of a measurement includes the plural nMOS transistors such as nMOS transistors 314, 315, 316, and 317. Each of drain electrodes of the plural nMOS transistors 314, 315, 316, and 317 is connected to the drain electrode of the control transistor 311. In addition, each of source electrodes and gate electrodes of the plural nMOS transistors 314, 315, 316, and 317 is grounded. The transistor 312 as an object of a measurement includes a sufficient number of nMOS transistors (for example, several tens of nMOS transistors) so that a total value of the leakage currents from the nMOS transistor 314 and the like becomes larger than the value of the leakage current from the control transistor 311.

As described above, in the modified change of the first embodiment, the transistor 312 as an object of a measurement includes the plural nMOS transistors connected in parallel with one another. As a result, even when a gate width is not adjusted, the large leakage current whose value is larger than that of the leakage current from the control transistor 311 can be leaked from the transistor 312 as an object of a measurement.

2. Second Embodiment

Configuration of Test Circuit

Figure 8:
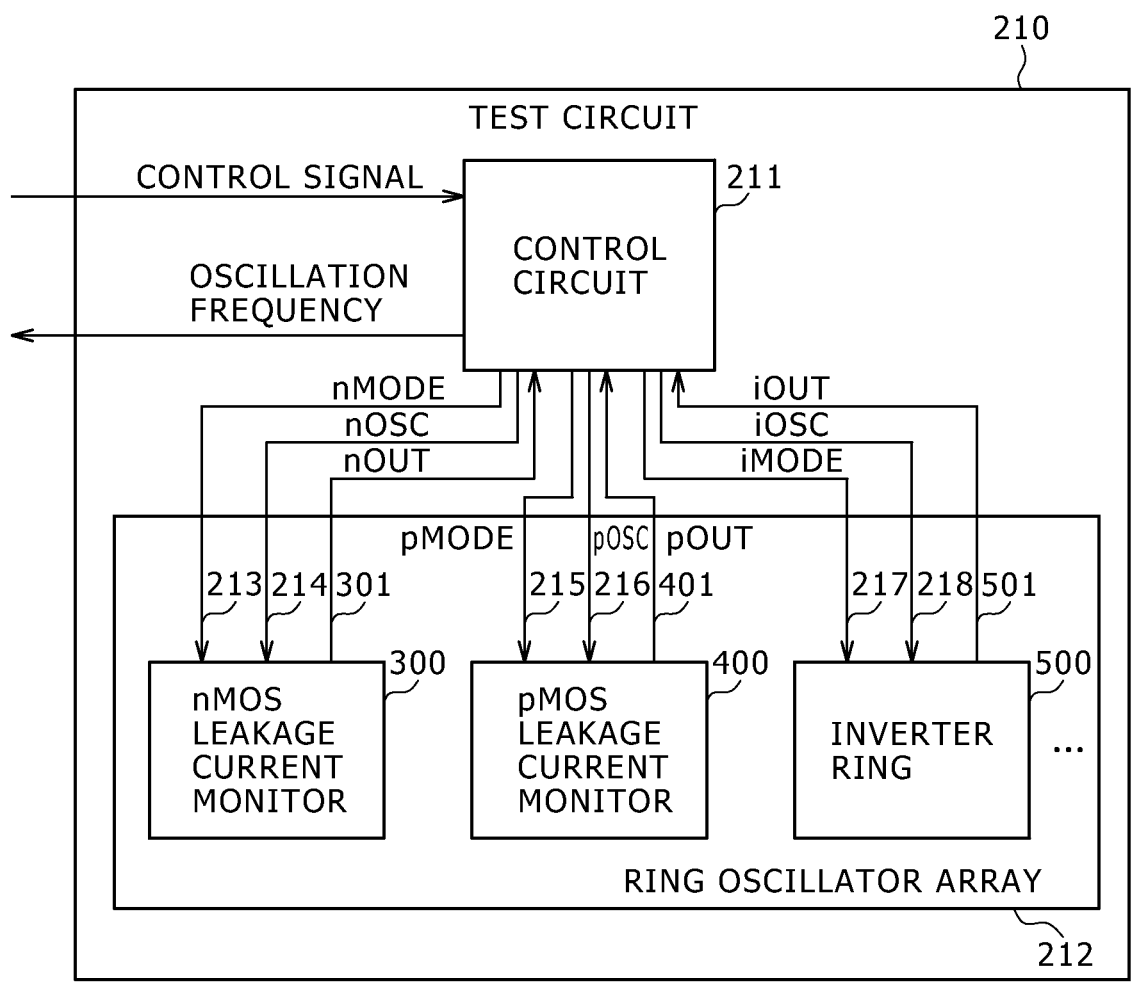
FIG. 8 is a block diagram showing a configuration of a test circuit according to a second embodiment of the present disclosure.

A test circuit according to a second embodiment of the present disclosure will be described below with reference to FIGS. 8 to 14. FIG. 8 is a block diagram showing a configuration of the test circuit 210 according to the second embodiment of the present disclosure. The test circuit 210 of the second embodiment is different from the test circuit 210 of the first embodiment in that the control circuit 211 further outputs mode signal MODE to the nMOS leakage current monitor 300, the pMOS leakage current monitor 400, and the inverter ring 500, respectively. The mode signals MODE are composed of mode signals nMODE, pMODE, and iMODE which are inputted to the nMOS leakage current monitor 300, the pMOS leakage current monitor 400 and the inverter ring 500, respectively.

The mode signal MODE is a signal in accordance with which it is instructed whether or not the signal is delayed in accordance with the leakage current. For example, the mode signal is set to a low level when the signal is delayed in accordance with the leakage current, and is set to a high level when the signal is not delayed in accordance with the leakage current. Also, each of the mode signals MODE is controlled in accordance with the control signal. For example, a time for which the mode signals MODE are each held at the low level or at the high level is instructed in accordance with the control signal.

When the oscillation control signal (nOSC, pOSC or iOSC) is held at the high level and the mode signal MODE is held at the low level, the output signal (nOUT, pOUT or iOUT) is changed at the frequency corresponding to the leakage current. In this case, the control circuit 211 measures the frequency of the output signal and outputs the resulting output signal. On the other hand, when each of the oscillation control signal and the mode signal MODE is held at the high level, the output signal is changed at the frequency corresponding to the on-state current. In this case, the control circuit 211 does not measure the frequency of the output signal and sets the mode signal MODE to the low level after a lapse of a given time.

Each of the oscillation control signal and the mode signal MODE is held at the high level, whereby the output signal oscillates at the frequency corresponding to the on-state current, and the transistor as the object of the measurement by the test circuit 210 is deteriorated in correspondence to a time for which the oscillation of the output signal continues. For this reason, the leakage currents are measured before and after the deterioration of the transistor, thereby making it possible to obtain the degree of the deterioration of the transistor. It is noted that when the transistor is deteriorated, for the purpose of shortening a test time, for example, a technique for placing the test circuit 210 under an environment at a higher temperature or a higher voltage than that in a phase of a normal operation, and accelerating the deterioration of the transistor is normally used.

[Configuration of nMOS Leakage Current Monitor]

Figure 9:
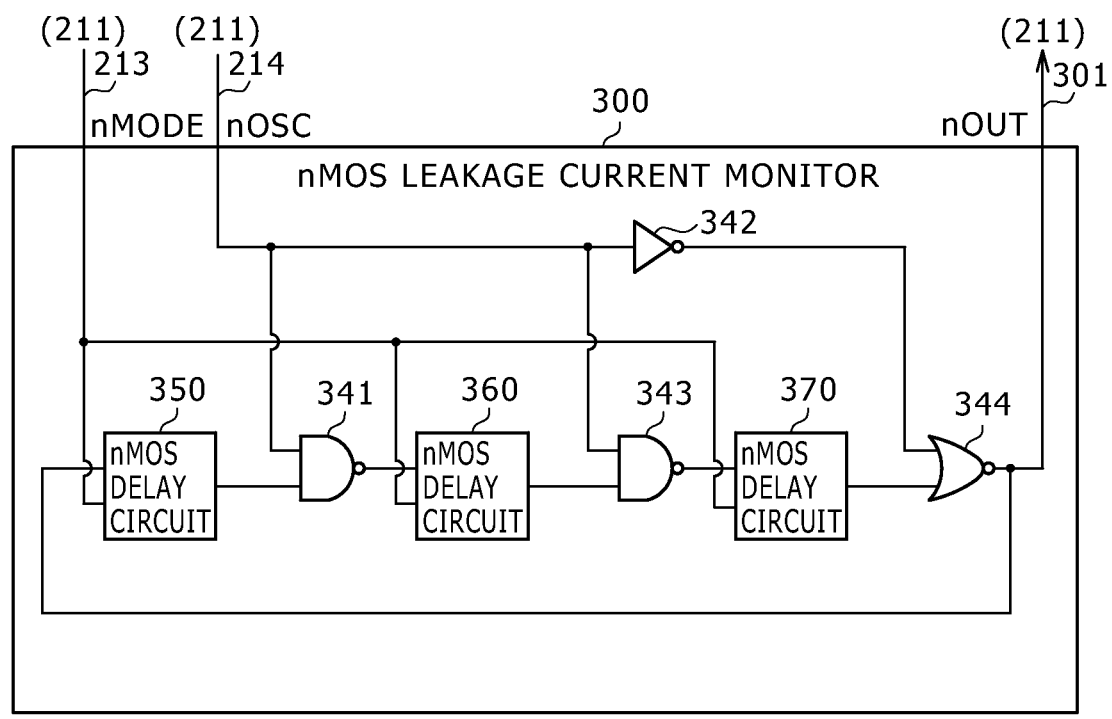
FIG. 9 is a circuit diagram showing a configuration of an nMOS leakage current monitor in the test circuit according to the second embodiment of the present disclosure.

FIG. 9 is a circuit diagram showing a configuration of the nMOS leakage current monitor 300 in the test circuit 210 of the second embodiment. A configuration of the nMOS leakage current monitor 300 in the test circuit 210 of the second embodiment is identical to that of the nMOS leakage current monitor 300 in the test circuit 210 of the first embodiment except that a mode signal nMODE is inputted to the nMOS leakage current monitor 300, and the nMOS leakage current monitor 300 includes nMOS delay circuits 350, 360, and 370 instead of including nMOS delay circuits 310, 320, and 330.

The nMOS delay circuit 350 changes a delay time of a signal in accordance with the mode signal nMODE. For example, when the mode signal nMODE is held at the low level, the nMOS delay circuit 350 delays the signal in accordance with the leakage current. On the other hand, when the mode signal nMODE is held at the high level, the nMOS delay circuit 350 delays the signal in accordance with the on-state current. Each of configurations of the nMOS delay circuits 360 and 370 is identical to that of the nMOS delay circuit 350.

[Configuration of nMOS Delay Circuit]

Figure 10:
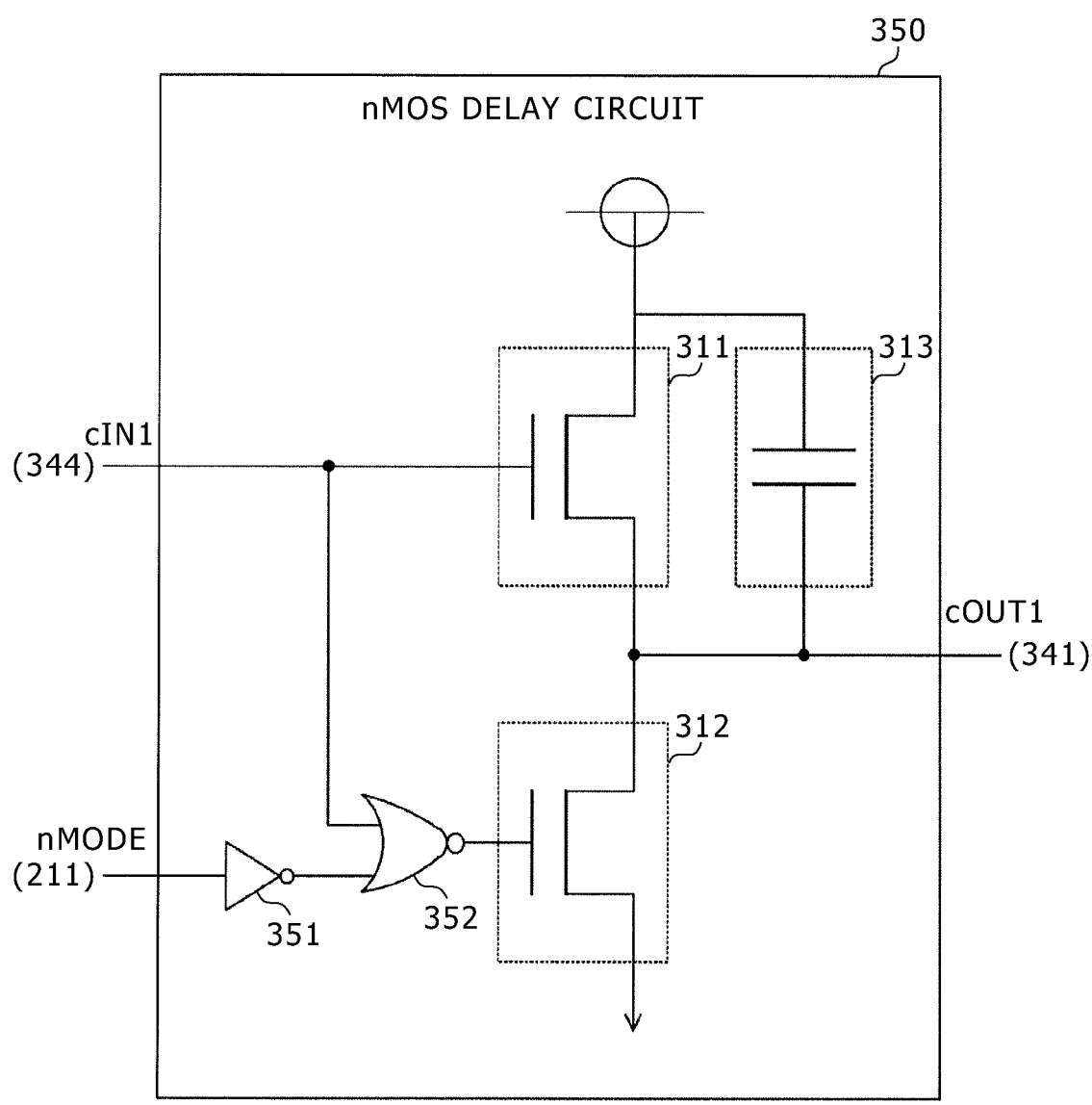
FIG. 10 is a circuit diagram showing a configuration of an nMOS delay circuit in the nMOS leakage current monitor in the test circuit according to the second embodiment of the present disclosure.

FIG. 10 is a circuit diagram showing a configuration of the nMOS delay circuit 350 in the nMOS leakage current monitor 300 in the test circuit 210 of the second embodiment. The nMOS delay circuit 350 in the nMOS leakage current monitor 300 in the test circuit 210 of the second embodiment is different in configuration from the nMOS delay circuit 310 in the nMOS leakage current monitor 300 in the test circuit 210 of the first embodiment in that the nMOS delay circuit 350 further includes an inverter 351 and a NOR gate 352. In addition, the gate electrode of the transistor 312 as an object of a measurement in the nMOS delay circuit 350 is not grounded, but is connected to an output terminal of the NOR gate 352.

The inverter 351 inverts the mode signal nMODE and outputs the inverted mode signal to an input terminal of the NOR gate 352. The NOR gate 352 outputs a negative OR of an input signal cIN1 and the mode signal nMODE obtained through the inversion in the inverter 351 to the gate electrode of the transistor 312 as an object of a measurement.

Addition of both of the inverter 351 and the NOR gate 352 results in that when the mode signal nMODE is held at the low level, the transistor 312 as an object of a measurement is usually held in the non-conduction state irrespective of the change of the input signal cIN1. For this reason, the fall delay time $T_{fall}$ becomes a time corresponding to the leakage current. On the other hand, when the mode signal nMODE is held at the high level, the transistor 312 as an object of a measurement becomes either the non-conduction state or the conduction state in accordance with the change of the input signal cIN1. Specifically, the transistor 312 as an object of a measurement becomes the non-conduction state when the input signal cIN1 is held at the high level, and becomes the conduction state when the input signal cIN1 is held at the low level. As a result, the fall delay time $T_{fall}$ becomes a time corresponding to the on-state current.

It is noted that the circuit for controlling the delay is by no means limited to the circuit composed of the inverter 351 and the NOR gate 352 as long as it is possible to control whether or not the delay is caused in accordance with the leakage current. For example, a circuit composed of an inverter and an AND (logical product) may be substituted for the circuit composed of the inverter 351 and the NOR gate 352 based on the De Morgan's theorem. In this case, it is only necessary that the inverter inverts the input signal cIN1, and the AND gate outputs a logical product of the inverted signal and the mode signal nMODE to the transistor 312 as an object of a measurement.

[Configuration of pMOS Leakage Current Monitor]

Figure 11:
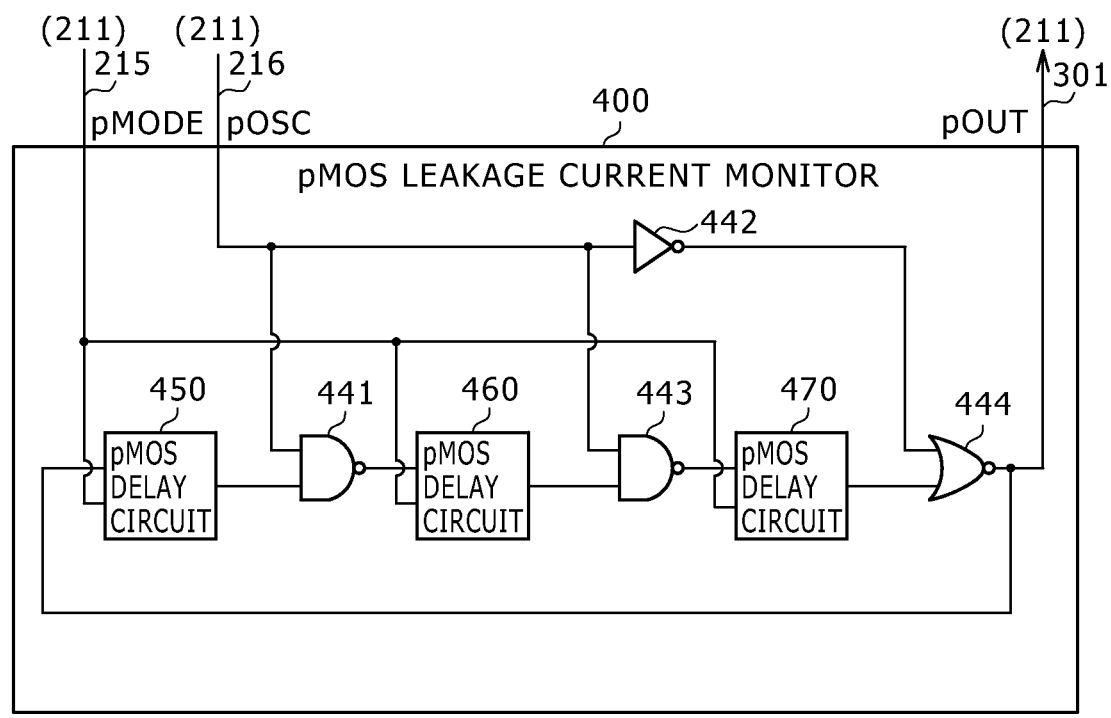
FIG. 11 is a circuit diagram showing a configuration of a pMOS leakage current monitor in the test circuit according to the second embodiment of the present disclosure.

FIG. 11 is a circuit diagram showing a configuration of the pMOS leakage current monitor 400 in the test circuit 210 of the second embodiment. The configuration of the pMOS leakage current monitor 400 in the test circuit 210 of the second embodiment is identical to that of the pMOS leakage current monitor 400 in the test circuit 210 of the first embodiment except that the mode signal pMODE is inputted to the pMOS leakage current monitor 400, and the pMOS leakage current monitor 400 includes pMOS delay circuits 450, 460, and 470 instead of including the pMOS delay circuits 410, 420, and 430.

Each of the pMOS delay circuits 450, 460, and 470 changes the delay time of the signal in accordance with the mode signal pMODE.

[Configuration of pMOS Delay Circuit]

Figure 12:
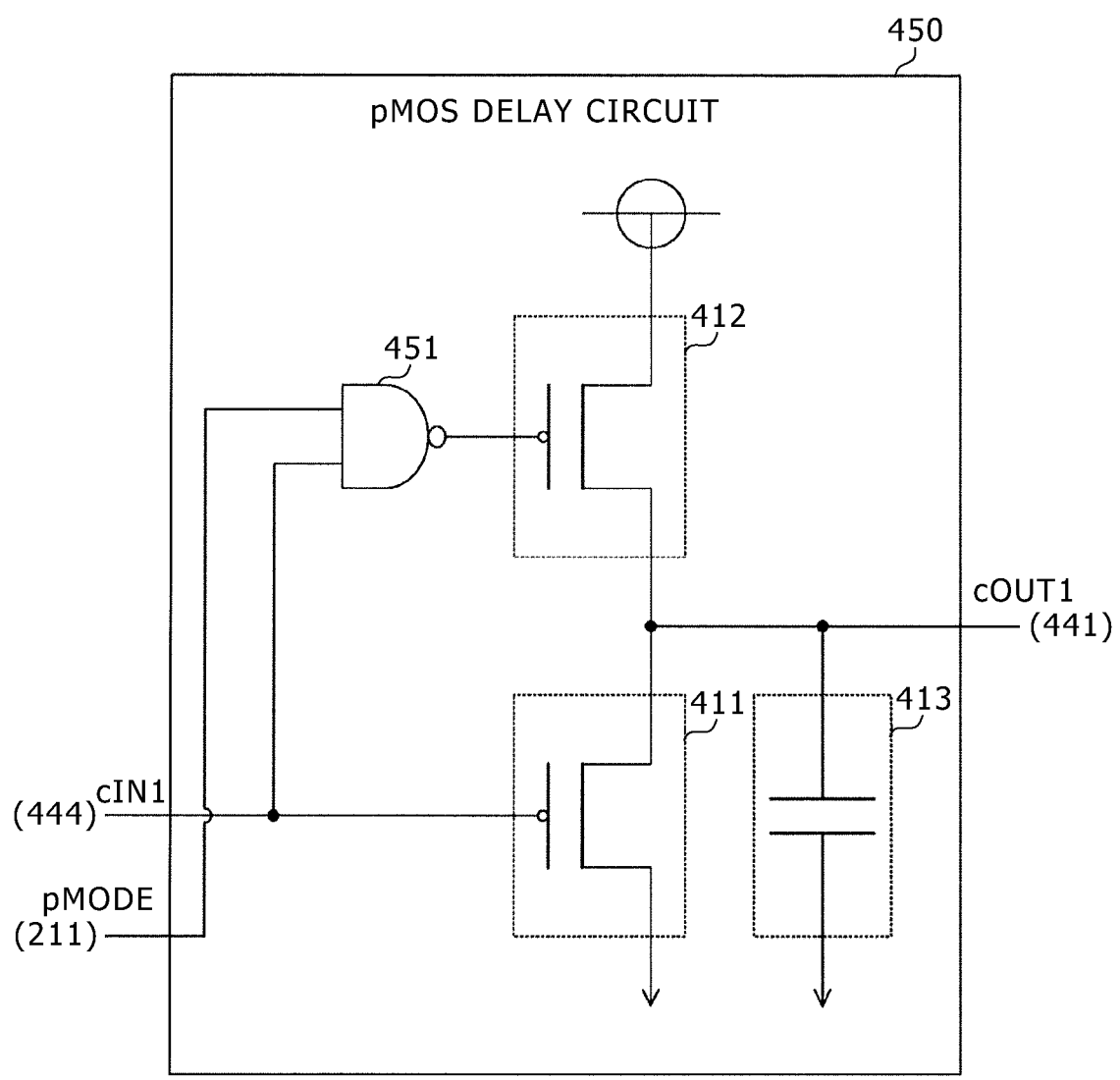
FIG. 12 is a circuit diagram showing a configuration of a pMOS delay circuit in the pMOS leakage current monitor in the test circuit according to the second embodiment of the present disclosure.

FIG. 12 is a circuit diagram showing a configuration of the pMOS delay circuit 450 in the pMOS leakage current monitor 400 in the test circuit 210 of the second embodiment. The pMOS delay circuit 450 in the pMOS leakage current monitor 400 in the test circuit 210 of the second embodiment is different in configuration from the pMOS delay circuit 410 in the pMOS leakage current monitor 400 in the test circuit 210 of the first embodiment in that the pMOS delay circuit 450 further includes a NAND gate 451. In addition, the gate electrode of the transistor 412 as an object of a measurement is not connected to the power source, but is connected to an output terminal of the NAND gate 451.

The NAND gate 451 outputs a negative AND of the input signal cIN1 and the mode signal pMODE to the gate electrode of the transistor 412 as an object of a measurement.

Addition of the NAND gate 451 results in that when the mode signal pMODE is held at the low level, the transistor 412 as an object of a measurement is usually held in the non-conduction state, and thus the rise delay time $T_{rise}$ becomes a time corresponding to the leakage current. On the other hand, when the mode signal pMODE is held at the high level, the transistor 412 as an object of a measurement becomes either the non-conduction state or the conduction state in correspondence to the input signal cIN1, and thus the rise delay time $T_{rise}$ becomes a time corresponding to the on-state current.

It is noted that the circuit for controlling the delay is by no means limited to the circuit composed of the NAND gate 451 as long as it is possible to control whether or not the delay is caused in accordance with the leakage current.

[Operation of nMOS Leakage Current Monitor]

FIG. 13 is a table explaining an operation of the nMOS leakage current monitor 300 in the test circuit 210 of the second embodiment. When the oscillation control signal nOSC is held at the high level and the mode signal nMODE is held at the low level, the transistor 312 as an object of a measurement in the nMOS leakage current monitor 300 is usually held in the non-conduction state. For this reason, the output signal nOUT is changed at the frequency corresponding to the leakage current. The leakage current is measured from the oscillation frequency.

When each of the oscillation control signal nOSC and the mode signal nMODE is held at the high level, the transistor 312 as an object of a measurement is usually held either in the conduction state or in the non-conduction state in accordance with the input signal. For this reason, the output signal nOUT is changed at the frequency corresponding to the on-state current. The output signal nOUT is continuously oscillated for a long time at the frequency corresponding to the on-state current, thereby deteriorating the transistor 312 as an object of a measurement.

When the oscillation control signal nOSC is held at the low level, the output signal nOSC is fixed to the low level irrespective of the mode signal nMODE and thus the oscillation is stopped. The transistor 312 as an object of a measurement is fixed either to the non-conduction state or to the conduction state in accordance with the mode signal nMODE. Specifically, the transistor 312 as an object of a measurement is fixed to the conduction state when the mode signal nMODE is held at the high level, and is fixed to the non-conduction state when the mode signal nMODE is held at the low level.

[Operation of Control Circuit]

FIG. 14 is a flow chart explaining an operation of the control circuit 211 in the test circuit 210 of the second embodiment. This operation, for example, is started when the test for measuring the degree of a temporal change of a transistor is started. In processing in Step S910, the control circuit 211 sets the mode signal MODE to the low level, and measures a leakage current of a transistor before the deterioration of the transistor.

Next, in processing in Step S920, the control circuit 211 sets the mode signal MODE to the high level and thus deteriorates the transistor under an environment at a high temperature, a high voltage, and the like. Also, in processing in Step S930, the control circuit 211 sets the mode signal MODE to the low level, and measures the leakage current of the transistor after the deterioration of the transistor under the environment at the high temperature, the high voltage, and the like. After completion of the processing in Step S930, the control circuit 211 ends the operation. The degree of the deterioration of the transistor is obtained from the leakage currents, before and after the deterioration of the transistor, which are measured in the processing in Step S910 and the processing in Step S930, respectively.

As described above, according to the second embodiment of the present disclosure, the nMOS leakage current monitor 300 can oscillate the output signal at one of the frequency corresponding to the leakage current and the frequency corresponding to the on-state current. Specifically, when the mode signal nMODE held at the low level and instructing the delay is inputted, the nMOS leakage current monitor 300 holds the nMOS transistor in the non-conduction state. On the other hand, when the mode signal nMODE held at the high level is inputted, the nMOS leakage current monitor 300 holds the nMOS transistor either in the non-conduction state or in the conduction state in accordance with the input signal cIN1. As a result, when the mode signal nMODE is held at the low level, the output signal nOUT is oscillated at the frequency corresponding to the leakage current, and when the mode signal nMODE is held at the high level, the output signal nOUT is changed at the frequency corresponding to the on-state current. Therefore, when the output signal nOUT is oscillated for a long time at the frequency corresponding to the on-state current, and the leakage currents before and after the long time oscillation are measured, respectively, the degree of the deterioration of the nMOS transistor is obtained from those leakage currents. This also applies to the pMOS transistor.

It is noted that the embodiments described above merely show examples for embodying the present disclosure, and the matters in the embodiments and the matters specifying the present disclosure in the appended claims have the correspondence relationship. Likewise, the matters specifying the present disclosure in the appended claims, and the matters in the embodiments of the present disclosure to which the same names as those in the matters specifying the present disclosure in the appended claims are added have the correspondence relationship. However, the present disclosure is by no means limited to the embodiments described above, and can be embodied by making various changes in the embodiments without depending from the subject matter of the present disclosure.

It is noted that the present disclosure can also adopt the following constitutions.

(1) An oscillation circuit including:

a control transistor changing an electric potential at an output terminal thereof by proceeding to one of a conduction state and a non-conduction state in accordance with an electric potential at an input terminal thereof;

a transistor as an object of a measurement having a polarity of a channel which is identical to a polarity of a channel of the control transistor, and connected in series with the control transistor between a power source and a ground;

a capacitor delaying the change in the electric potential at the output terminal of the control transistor in accordance with a value of a leakage current leaked from the transistor as an object of a measurement when the control transistor proceeds from the conduction state to the non-conduction state; and an inversion circuit inverting the electric potential at the output terminal of the control transistor, thereby feeding the inverted electric potential back to the input terminal of the control transistor.

(2) The oscillation circuit described in the paragraph (1), further including a delay controlling portion configured to cause the transistor as an object of a measurement to proceed to the non-conduction state when a delay instruction signal to instruct the change of the electric potential at the output terminal of the control transistor to be delayed is inputted, and cause the transistor as an object of a measurement to proceed to one of the conduction state and the non-conduction state in accordance with the electric potential at the input terminal of the control transistor when the delay instruction signal is not inputted.

(3) The oscillation circuit described in the paragraph (1), in which the transistor as an object of a measurement includes:

a control terminal through which the transistor as an object of a measurement is controlled so as to be held either in the conduction state or in the non-conduction state;

a first connection terminal connected either to the power source or to the ground, and the control terminal; and a second connection terminal connected to the output terminal of the control transistor.

(4) The oscillation circuit described in any one of the paragraphs (1) to (3), in which the transistor as an object of a measurement is a transistor from which a leakage current whose value is larger than that of a leakage current leaked from the control transistor is leaked when each of the transistor as an object of a measurement, and the control transistor is held in the non-conduction state.

(5) The oscillation circuit described in the paragraph (4), in which the transistor as an object of a measurement includes plural transistors connected in parallel with one another between the power source and the ground; and the plural transistors are transistors each having a polarity of a channel which is identical to a polarity of a channel of the control transistor.

(6) The oscillation circuit described in any one of the paragraphs (1) to (5), in which the inversion circuit inverts the electric potential at the output terminal of the control transistor, thereby feeding the inverted electric potential back to the input terminal of the control transistor when an oscillation instruction signal to instruct the electric potential at the output terminal to oscillate is inputted, and fixes the electric potential at the input terminal to a predetermined electric potential when the oscillation instruction signal is not inputted.

(7) An oscillation circuit including:

a delay circuit group having plural delay circuits each including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of the control transistor, and connected in series with the control transistor between a power source and a ground, and a capacitor delaying the change in the electric potential at the output terminal of the control transistor in accordance with a value of a leakage current leaked from the transistor as an object of a measurement when the control transistor proceeds from the conduction state to the non-conduction state, the plural delay circuits being connected in a ring-like shape by connection between the output terminals and the input terminals of the plural delay circuits; and an oscillation controlling circuit inverting the electric potentials at the output terminals of the plural delay circuits, thereby making the inverted electric potentials the electric potentials at the input terminals connected to the respective output terminals when an oscillation instruction signal to instruct the electric potentials at the output terminals of the plural delay circuits to oscillate is inputted, and fixing the electric potentials at the input terminals in such a way that at least one of the electric potentials at the input terminals of the plural delay circuits becomes an electric potential having a different polarity when the oscillation instruction signal is not inputted.

(8) A test circuit including:

an oscillation circuit including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of the control transistor, and connected in series with the control transistor between a power source and a ground, a capacitor delaying the change in the electric potential at the output terminal in accordance with a leakage current leaked from the transistor as an object of a measurement when the control transistor proceeds from the conduction state to the non-conduction state, and an inversion circuit inverting the electric potential at the output terminal of the control transistor, thereby feeding the inverted electric potential back to the input terminal of the control transistor; and a counting circuit counting the number of times by which the electric potential at the output terminal is inverted within a predetermined period of time.

(9) A test circuit including:

a delay circuit group having plural delay circuits each including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of the control transistor, and connected in series with the control transistor between a power source and a ground, and a capacitor delaying the change in the electric potential at the output terminal of the control transistor in accordance with a value of a leakage current leaked from the transistor as an object of a measurement when the control transistor proceeds from the conduction state to the non-conduction state, the plural delay circuits being connected in a ring-like shape by connection between the output terminals and the input terminals of the plural delay circuits;

an oscillation controlling circuit inverting the electric potentials at the output terminals of the plural delay circuits, thereby making the inverted electric potentials the electric potentials at the input terminals connected to the respective output terminals when an oscillation instruction signal to instruct the electric potentials at the output terminals of the plural delay circuits to oscillate is inputted, and fixing the electric potentials at the input terminals in such a way that at least one of the electric potentials at the input terminals of the plural delay circuits becomes an electric potential having a different polarity when the oscillation instruction signal is not inputted; and a counting circuit counting the number of times by which the electric potential at any one of the output terminal is inverted within a predetermined period of time.

The present disclosure contains subject matter related to that disclosed in Japanese Priority Patent Application JP 2011-258424 filed in the Japan Patent Office on Nov. 28, 2011, the entire content of which is hereby incorporated by reference.

What is claimed is:

1. An oscillation circuit, comprising:
a control transistor changing an electric potential at an output terminal thereof by proceeding to one of a conduction state and a non-conduction state in accordance with an electric potential at an input terminal thereof;
a transistor as an object of a measurement having a polarity of a channel which is identical to a polarity of a channel of said control transistor, and connected in series with said control transistor between a power source and a ground;
a capacitor delaying the change in the electric potential at said output terminal of said control transistor in accordance with a value of a leakage current leaked from said transistor as an object of a measurement when said control transistor proceeds from the conduction state to the non-conduction state; and
an inversion circuit inverting the electric potential at said output terminal of said control transistor, thereby feeding the inverted electric potential back to said input terminal of said control transistor.

2. The oscillation circuit according to claim 1, further comprising
a delay controlling portion configured to cause said transistor as an object of a measurement to proceed to the non-conduction state when a delay instruction signal to instruct the change of the electric potential at said output terminal of said control transistor to be delayed is inputted, and cause said transistor as an object of a measurement to proceed to one of the conduction state and the non-conduction state in accordance with the electric potential at said input terminal of said control transistor when the delay instruction signal is not inputted.

3. The oscillation circuit according to claim 1,
wherein said transistor as an object of a measurement includes:
a control terminal through which said transistor as an object of a measurement is controlled so as to be held either in the conduction state or in the non-conduction state;
a first connection terminal connected either to said power source or to said ground, and said control terminal; and
a second connection terminal connected to said output terminal of said control transistor.

4. The oscillation circuit according to claim 1, wherein said transistor as an object of a measurement is a transistor from which a leakage current whose value is larger than that of a leakage current leaked from said control transistor is leaked when each of said transistor as an object of a measurement, and said control transistor is held in the non-conduction state.

5. The oscillation circuit according to claim 4,
wherein said transistor as an object of a measurement includes plural transistors connected in parallel with one another between said power source and said ground; and
said plural transistors are transistors each having a polarity of a channel which is identical to a polarity of a channel of said control transistor.

6. The oscillation circuit according to claim 1, wherein said inversion circuit inverts the electric potential at said output terminal of said control transistor, thereby feeding the inverted electric potential back to said input terminal of said control transistor when an oscillation instruction signal to instruct the electric potential at said output terminal to oscillate is inputted, and fixes the electric potential at said input terminal to a predetermined electric potential when the oscillation instruction signal is not inputted.

7. An oscillation circuit, comprising:
a delay circuit group having plural delay circuits each including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of said control transistor, and connected in series with said control transistor between a power source and a ground, and a capacitor delaying the change in the electric potential at said output terminal of said control transistor in accordance with a value of a leakage current leaked from said transistor as an object of a measurement when said control transistor proceeds from the conduction state to the non-conduction state, said plural delay circuits being connected in a ring-like shape by connection between the output terminals and the input terminals of said plural delay circuits; and
an oscillation controlling circuit inverting the electric potentials at the output terminals of said plural delay circuits, thereby making the inverted electric potentials the electric potentials at the input terminals connected to the respective output terminals when an oscillation instruction signal to instruct the electric potentials at the output terminals of said plural delay circuits to oscillate is inputted, and fixing the electric potentials at the input terminals in such a way that at least one of the electric potentials at the input terminals of said plural delay circuits becomes an electric potential having a different polarity when the oscillation instruction signal is not inputted.

8. A test circuit, comprising:
an oscillation circuit including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of said control transistor, and connected in series with said control transistor between a power source and a ground, a capacitor delaying the change in the electric potential at said output terminal in accordance with a leakage current leaked from said transistor as an object of a measurement when said control transistor proceeds from the conduction state to the non-conduction state, and an inversion circuit inverting the electric potential at said output terminal of said control transistor, thereby feeding the inverted electric potential back to said input terminal of said control transistor; and
a counting circuit counting the number of times by which the electric potential at said output terminal is inverted within a predetermined period of time.

9. A test circuit, comprising:
a delay circuit group having plural delay circuits each including a control transistor changing an electric potential at an output terminal thereof by proceeding to one of a conduction state and a non-conduction state in accordance with an electric potential at an input terminal thereof, a transistor as an object of a measurement having a polarity of a channel which is identical to a polarity of a channel of said control transistor, and connected in series with said control transistor between a power source and a ground, and a capacitor delaying the change in the electric potential at said output terminal of said control transistor in accordance with a value of a leakage current leaked from said transistor as an object of a measurement when said control transistor proceeds from the conduction state to the non-conduction state, said plural delay circuits being connected in a ring-like shape by connection between the output terminals and the input terminals of said plural delay circuits;

an oscillation controlling circuit inverting the electric potentials at the output terminals of said plural delay circuits, thereby making the inverted electric potentials the electric potentials at the input terminals connected to the respective output terminals when an oscillation instruction signal to instruct the electric potentials at the output terminals of said plural delay circuits to oscillate is inputted, and fixing the electric potentials at the input terminals in such a way that at least one of the electric potentials at the input terminals of said plural delay circuits becomes an electric potential having a different polarity when the oscillation instruction signal is not inputted; and a counting circuit counting the number of times by which the electric potential at any one of the output terminals is inverted within a predetermined period of time.

* * * * *